United States Patent
Tokuno et al.

(10) Patent No.: US 7,767,006 B2
(45) Date of Patent: Aug. 3, 2010

(54) OZONE PROCESSING APPARATUS AND OZONE PROCESSING METHOD

(75) Inventors: Yoshichika Tokuno, Tosu (JP); Norihiro Ito, Tosu (JP); Takehiko Orii, Nirasaki (JP); Mitsunori Nakamori, Nirasaki (JP); Tadashi Iino, Nirasaki (JP); Hiroki Ohno, Minato-Ku (JP); Yusuke Saito, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 994 days.

(21) Appl. No.: 10/581,729

(22) PCT Filed: Dec. 16, 2004

(86) PCT No.: PCT/JP2004/018791
§ 371 (c)(1),
(2), (4) Date: Jun. 5, 2006

(87) PCT Pub. No.: WO2005/058753
PCT Pub. Date: Jun. 30, 2005

(65) Prior Publication Data
US 2007/0107751 A1    May 17, 2007

(30) Foreign Application Priority Data

Dec. 17, 2003  (JP) .............................. 2003-419044
Jun. 4, 2004   (JP) .............................. 2004-167081
Jun. 4, 2004   (JP) .............................. 2004-167082

(51) Int. Cl.
*B01D 59/26* (2006.01)

(52) U.S. Cl. ................ 96/108; 95/138; 134/2; 134/10; 134/109

(58) Field of Classification Search .................. 95/138; 134/2, 10, 109; 96/108
See application file for complete search history.

(56) References Cited

U.S. PATENT DOCUMENTS

| 4,816,121 | A | * | 3/1989 | Keefer ......................... 204/156 |
| 5,141,717 | A | * | 8/1992 | McRae .................... 422/82.01 |
| 5,846,298 | A | * | 12/1998 | Weist, Jr. ..................... 95/138 |
| 5,853,457 | A | * | 12/1998 | Eysmondt et al. ............. 95/138 |
| 6,190,436 | B1 | * | 2/2001 | Ji et al. ........................... 95/45 |

(Continued)

FOREIGN PATENT DOCUMENTS

JP    59-010925    1/1984

(Continued)

OTHER PUBLICATIONS

Machine Translation of JP2001-248794, Murai, Mar. 2, 2000.*

(Continued)

*Primary Examiner*—Robert J Hill, Jr.
*Assistant Examiner*—Christopher P Jones
(74) *Attorney, Agent, or Firm*—Morrison & Foerster LLP (57) ABSTRACT

Water vapor is mixed to $O_3$ gas generated by an ozone generator of discharge type. The mixed fluid is cooled by a cooler, thereby impurities such as metals and nitrogen oxides contained in the $O_3$ gas dissolve into condensed water. Subsequently, a gas-liquid separator separates the $O_3$ gas from the condensed water. Water vapor is mixed with the $O_3$ gas again. The mixed fluid passes through a metal trap composed of a container containing plural silicon chips as a metal adsorbent, thereby to remove the remaining metals therefrom.

4 Claims, 7 Drawing Sheets

U.S. PATENT DOCUMENTS

| 6,530,976 | B2 | 3/2003 | Murai | |
|---|---|---|---|---|
| 2001/0022135 | A1* | 9/2001 | Murai | 95/138 |

FOREIGN PATENT DOCUMENTS

| JP | 61-025645 | 2/1986 |
|---|---|---|
| JP | 01-282104 | 11/1989 |
| JP | 08-059214 | 3/1996 |
| JP | 11-290650 | 10/1999 |
| JP | 2000-064073 | 2/2000 |
| JP | 2001-248794 | 9/2001 |

OTHER PUBLICATIONS

Machine Translation of JP2000-064073A, Wada, Feb. 29, 2000.*
Notification of Reason for Rejection mailed May 26, 2009, for JP Patent Application No. 2005-516331, with English Translation, 6 pages.

* cited by examiner

OZONE PROCESSING APPARATUS AND OZONE PROCESSING METHOD

TECHNICAL FIELD

The present invention relates to a method and an apparatus for processing a process object, such as a semiconductor wafer or a glass substrate for an LCD, with a process gas containing ozone gas, more specifically, to a technique for removing harmful impurities contained in the ozone gas.

BACKGROUND ART

In a semiconductor device manufacturing, a semiconductor wafer or a glass substrate for an LCD (hereinafter referred to as "substrate") is subjected to a series of process steps including: coating the substrate with a resist solution to form a resist film; transferring a circuit pattern, with scale reduction, to the resist film by using photolithography; developing the resist film; and thereafter removing the resist film from the substrate.

In view of the growing emphasis on environmental conservation in recent years, there has been recently proposed a resist-film removing method, which is free of problems relating to waste-liquid treatment and which uses ozone ($O_3$) and water vapor. In such a method, an ozone generator of a silent discharge type is generally used as ozone generating means, as described in the "Background Art" section of JP1-282104A. An ozone generator of a silent discharge type includes an ozone generating cell having a pair of electrodes and a dielectric body arranged between the electrodes, and generates ozone by passing oxygen through a discharging space formed by applying a high alternating voltage across the electrodes.

A dielectric body composed of a ceramic coating with Cr additive is often used in an ozone generator of a discharge type. In this case, Cr in the ceramic is sputtered by discharge energy, and is contained in ozone gas. If a substrate is processed with ozone gas containing Cr, metallic contamination of a substrate by Cr may possibly occur.

An ozone generator of a discharge type generates ozone gas with the use of oxygen ($O_2$) gas containing nitrogen ($N_2$) gas in order to improve ozone-gas generating efficiency. Thus, the generated ozone gas contains nitrogen oxides (NOx). NOx reacts with moisture to form nitric acid. If a processing vessel is formed of a stainless steel, nitric acid dissolves the processing vessel so that metallic components such as Cr elute from the processing vessel. The metallic components may possibly cause metallic contamination of a substrate.

The above metallic contamination is insignificant. However, the best possible reduction in such metallic contamination is desired in view of higher integration of semiconductor devices in the future.

JP8-59214A discloses an ozone generator equipped with a NOx removing means, which is composed of a container containing zeolite as a NOx adsorbent; or composed of a container containing pure water into which NOx contained in ozone gas is dissolved through a bubbling operation.

However, the NOx removing means disclosed in JP8-59214A can not achieve a sufficient NOx removing efficiency.

SUMMARY OF THE INVENTION

The object of the present invention is to improve efficiency of removing harmful impurities such as metals and NOx contained in ozone gas generated through electric discharge, thereby to prevent contamination of a process object when the ozone process is performed.

In the present invention, water vapor is mixed with ozone gas generated by an ozone generator of a discharge type, typically a silent discharge type.

If impurities such as a metal (e.g., Cr) or NOx is contained in ozone gas as described at the beginning of this specification, when a mixed fluid of the ozone gas and water vapor is cooled, the impurities are dissolved into condensed water generated by condensation of the water vapor. As ozone gas and water vapor are mixed with each other, in other words, gaseous matters are mixed with each other, the ozone gas and the water vapor can be mixed with each other with high uniformity. Thus, almost of the impurities contained in the ozone gas can be dissolved into the condensed water, when the water vapor is cooled. The ozone gas is separated from the condensed water by a gas-liquid separator. The process object is processed with the ozone gas thus purified.

In place of the above, or in addition to the above, the mixed fluid of ozone gas and the water vapor may bring into contact with an adsorbent composed of a silicon-containing material, so that the metal such as Cr contained in the ozone gas is adsorbed to the adsorbent and can be removed from the ozone gas effectively.

Various concrete embodiments of the present invention based on the foregoing basic technical concept will become apparent in view of the following description which will be made with reference to the attached drawings.

EXPLANATION OF REFERENCE SIGNS

| | |
|---|---|
| 1 | Ozone generator |
| 2 | Ozone supply line |
| 3, 3A, 3B | Steam generator |

-continued

| EXPLANATION OF REFERENCE SIGNS | |
|---|---|
| 4, 4A | Cooler |
| 5, 5A | Gas-liquid separator |
| 10 | Processing part |
| 100 | Metal trap |
| W | Semiconductor wafer (Process object) |

DESCRIPTION OF PREFERRED EMBODIMENTS

Preferred embodiments of the present invention will be described in detail below with reference to the attached drawings. The following description is made for embodiments in which an ozone processing apparatus is constructed to perform a process for converting a resist film formed on a semiconductor wafer into water-soluble one. In the respective embodiments, identical or similar reference numbers are given to identical or similar components members, and their duplicated description is omitted.

First Embodiment

Figure 1:
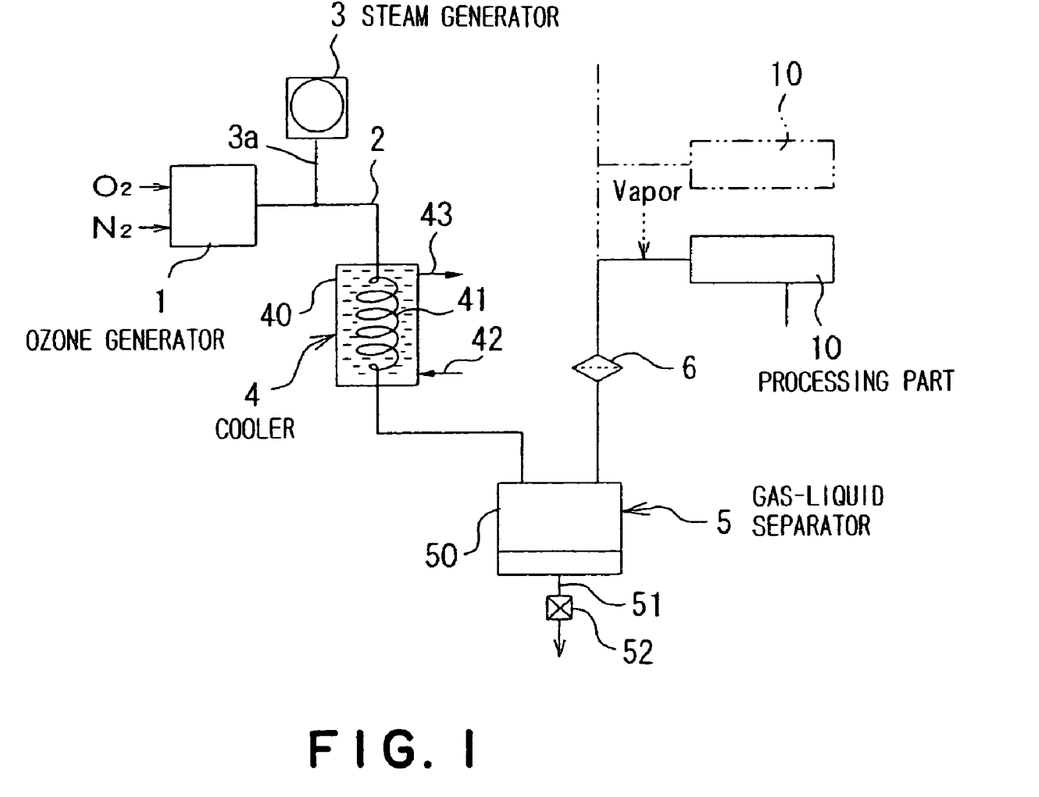
FIG. 1 is a schematic diagram showing the first embodiment of an ozone processing apparatus according to the present invention.

FIG. 1 is a schematic diagram showing the first embodiment of an ozone processing apparatus according to the present invention. The ozone processing apparatus includes: an ozone generator 1 (ozone generating means) that generates ozone gas through an electric discharge; an ozone supply line 2 that supplies the ozone gas generated by the ozone generator 1 into a processing part 10; and a steam generator (steam generating means) 3 that is connected to the supply line 2 to generate water vapor to be mixed with the ozone gas flowing through the supply line 2.

The supply line 2 is formed of a highly corrosion-resistant fluorine resin such as PFA (perfluoro alkoxyl alkane). The supply line 2 is provided with: a cooler (cooling means or condenser) 4 that cools a mixed fluid of ozone gas and water vapor; a gas-liquid separator 5 (gas-liquid separating means) that separates the condensed water into which impurities contained in the ozone gas are dissolved and the ozone gas from each other; and a filter 6; which are arranged in that order from the ozone generator 1 toward the processing part 10.

The ozone generator 1 is of a silent discharge type that includes an ozone generating cell having electrodes with a dielectric body layer composed of a ceramic coating. The ozone generator 1 generates ozone ($O_3$) gas by applying a high alternating voltage across the electrodes in the ozone generating cell into which oxygen ($O_2$) gas as an oxygen source and a gas, such as nitrogen ($N_2$) gas, for improving a discharge efficiency, are being supplied therethrough. An ozone generator of a silent discharge type is the most representative one of ozone generators for generating ozone gas through an electric discharge. As its structure is well-known, a detailed description of the structure of the ozone generator of a silent discharge type is not made herein. The ozone generator 1 used in this embodiment generates 4 liters of $O_3$ gas per minute, for example. The thus generated $O_3$ gas contains impurities such as chromium (Cr), nitrogen oxides (NOx), and particles that have been sputtered from the dielectric body by discharge energy. It is important to remove these impurities in order to prevent an adverse effect by the same on an ozone process.

The steam generator 3 generates water vapor by heating deionized water supplied thereinto by a heater (not shown). The steam generator 3 used in this embodiment is capable of generating 10 g of water vapor per minute, for example. The water vapor generated by the steam generator 3 is mixed with $O_3$ gas flowing through the supply line 2 via a steam supply line 3a. Since the mixed fluid flows turbulently through the supply line 2 at a high velocity, the $O_3$ gas and the water vapor are mixed with each other before they reach the cooler 4. In this case, by increasing a length of the supply line 2 from the joint between the supply line 2 and the steam supply line 3a to the cooler 4, a time period during which the $O_3$ gas and the water vapor are in contact with each other is prolonged, whereby the $O_3$ gas and the water vapor can be uniformly mixed each other. Alternatively, by increasing an amount of generated water vapor, the $O_3$ gas and the water vapor can be uniformly mixed each other.

The cooler 4 is mainly composed of: a cooling tank 40 made of quartz; a cooling water supply line 42 connected to a lower part of the cooling tank 40; and a cooling water discharge line 43 connected to an upper part of the cooling tank 40. Arranged in the cooling tank 40 is a heat exchanger 41 made of a quartz tube, which extends from an upper end to a lower end of the cooling tank 40 in a form of a coil, and the both ends of which is connected to the supply line 2. Cooling water discharged from the cooling tank 40 through the cooling water discharge line 43 is fed to a factory cooling water supply system (not shown) to be cooled therein, and then is returned to the cooling tank 40 through the cooling water supply line 42.

In the cooler 4, the mixed fluid of the $O_3$ gas and the water vapor flowing through the heat exchanger 41 serving as a part of the supply line 2 is cooled through the heat exchange between the mixed fluid and the cooling water (about 20° C.) supplied into the cooling tank 40, so that the water vapor is condensed. Impurities such as Cr and NOx are dissolved into the thus generated condensed water to be separated from the $O_3$ gas.

The gas-liquid separator 5 is composed of a buffer tank 5. A fluid inlet and a fluid outlet, which are connected to the supply line 2, are formed in an upper end of the buffer tank 50. A drain line 51 is connected to a lower end of the buffer tank 50. A drain valve 52 is arranged in the drain line 51.

When the mixed fluid of the condensed water with impurities dissolved therein and the $O_3$ gas is supplied into the buffer tank 50, the condensed water and the $O_3$ gas are separated from each other due to the difference in the specific gravity. The condensed water falls into the lower part of the buffer tank 50, while the $O_3$ gas is discharged into the portion of the supply line 2 downstream of the buffer tank 50. When the $O_3$ gas flown into the supply line 2 passes through the filter 6, impurities such as particles contained in the $O_3$ gas are removed from the $O_3$ gas. The $O_3$ gas purified in the above manner is mixed with water vapor for processing ("Vapor" indicated by the broken arrow), and is then supplied into the processing part 10.

Figure 4:
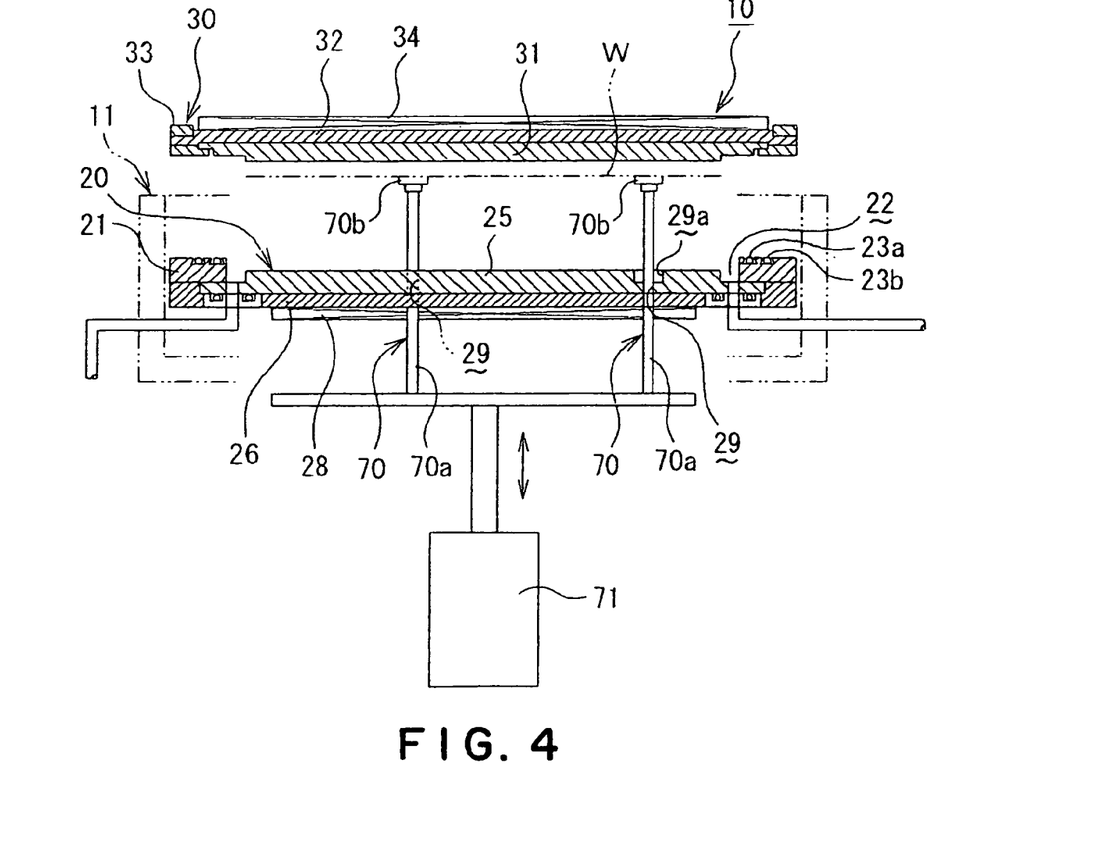
FIG. 4 is a cross-sectional view showing the structure of a processing part of the ozone processing apparatus.
Figure 5:
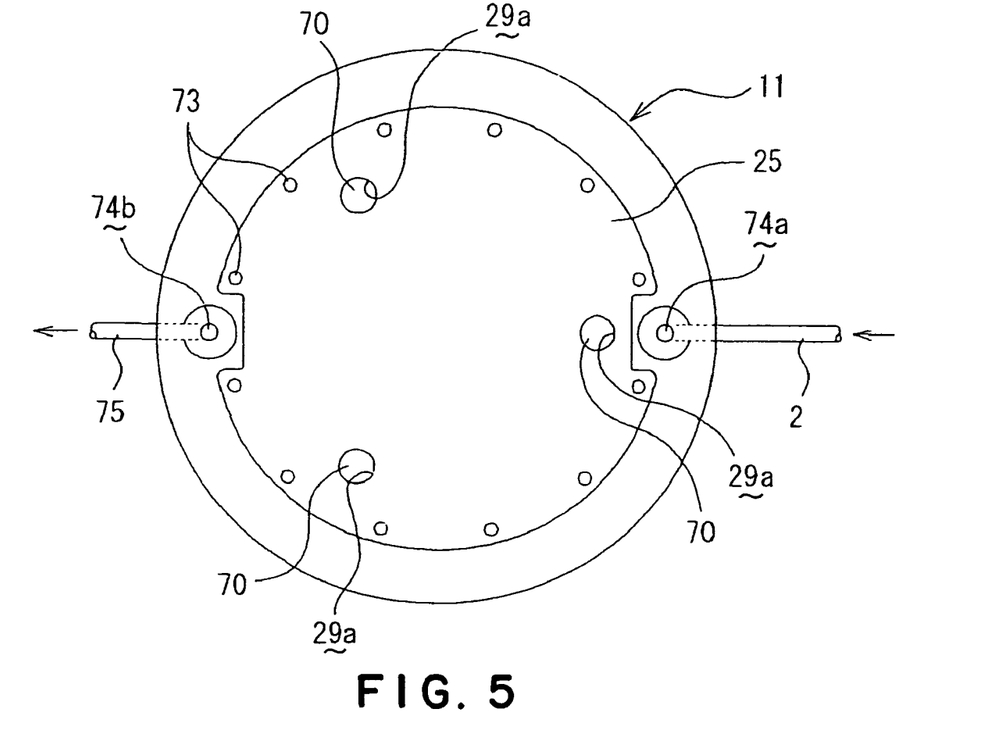
FIG. 5 is a top plan view of a vessel body of the processing part.
Figure 6:
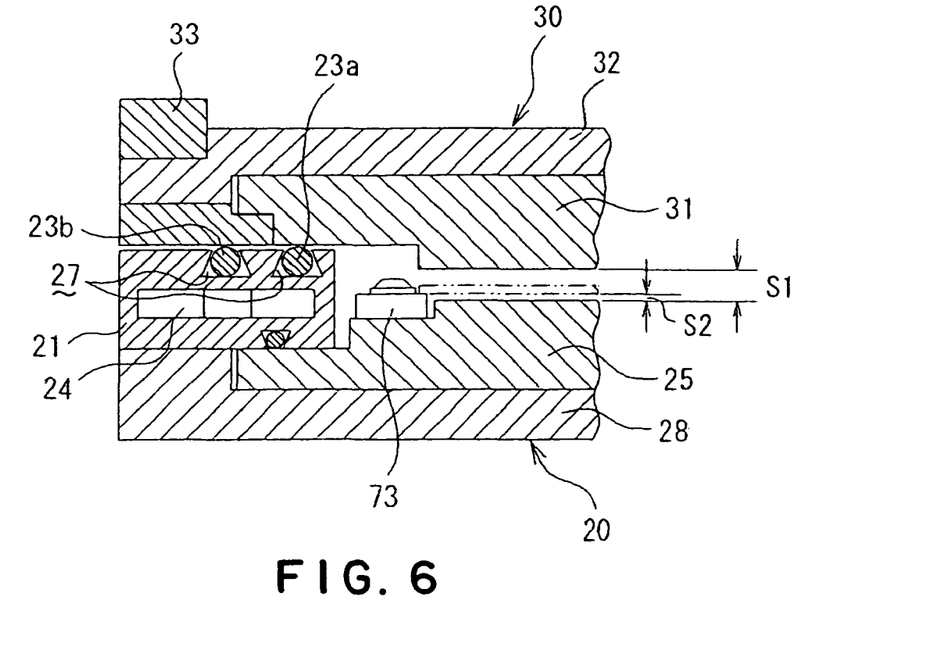
FIG. 6 is an enlarged cross-sectional view of a part of the processing part in a closed state.

As shown in FIGS. 4 to 6, the processing part (processing vessel) 10 is mainly composed of: a vessel body 11 that contains a wafer W as a process object; and a cover 30 that covers an upper surface of the vessel body 11 to define a processing space S1 between the cover 30 and a base 20 arranged in the vessel body 11, which will be described below.

The vessel body 11 includes: the disk-shaped base 20; a circumferential wall 21 standing from the periphery of the base 20; and a groove 22 circumferentially extending between the base 20 and the circumferential wall 21.

The cover 30 is composed of: a lower surface plate 31 formed of a sintered silicon carbide (SiC); a heat-conductive reinforcing plate 32 formed of a carbon steel joined to an upper surface of the lower surface plate 31; and a connecting ring member 33 disposed along peripheries of the lower surface plate 31 and the reinforcing plate 32 to secure the lower surface plate 31 and the reinforcing plate 32 to each other by using fixing bolts, not shown. A rubber heater 34 is joined to an upper surface of the reinforcing plate 32.

The base 20 is composed of: an upper surface plate 25 formed of a sintered SiC; a reinforcing plate 26 formed of a carbon steel joined to a lower surface of the upper surface plate 25; and the circumferential wall 21 formed of a fluorocarbon resin such as PFA. O-rings 23a and 23b are fitted in dual circumferential grooves 27 formed in a top surface of the circumferential wall 21. A reinforcing core material 24 formed of a stainless steel is buried in a center portion of the circumferential wall 21. A rubber heater 28 is joined to a lower surface of the reinforcing plate 26 of the base 20. When the upper surface of the circumferential wall 21 of the base 20 and the lower surface of the cover 30 are brought into tight contact with each other, the hermetically closed processing space S1 can be formed.

As the lower surface plate 31 of the cover 30 and the upper surface plate 25 of the base 20 are formed of the sintered SiC and the circumferential wall 21 is formed of PFA, the mixed fluid (process fluid) of $O_3$ gas and water vapor supplied into the processing space S1 does not cause elution of metallic components such as Cr or the like from surfaces facing the processing space S1. Thus, metallic contamination of the wafer W by the metallic components can be prevented.

Stepped through-holes 29 are formed in the base 20 at points dividing a circumference equally into three sectors. Support pins 70 are inserted into the respective through-holes 29, and can be vertically moved, that is, projected from and retracted into the upper surface of the base 20, by elevating means such as a cylinder actuator 71. Each of the support pins 70 includes a stainless-steel pin body 70a and a support member 70b attached to the upper end of the pin body 70a. The support member 70b is formed of PFA, and has a columnar shape of a larger diameter. The support member 70b is received in an upper hole part 29a with a larger diameter of the respective stepped through-hole 29, when the support pins 70 is in its lowered position.

A plurality of support members 73 (twelve members are shown) made of a synthetic resin such as PTFE are arranged at regular intervals on an upper surface of a peripheral part of the base 20. During an ozone process (process for making a resist water-soluble) of the wafer W, the support members 73 support the wafer W by contacting a periphery of the lower surface of the wafer W received in the vessel body 11. In this state, a gap S2 about 1 mm in height is formed between the lower surface of the supported wafer W and the upper surface of the base 20.

A supply port 74a for supplying a process fluid (mixed fluid of $O_3$ gas and water vapor) into the processing space S1, and a discharge port 74b for discharging the fluid from the processing space S1 are formed in the groove 22 at diametrically opposed positions. The supply line 2 is connected to the supply port 74a, while a discharge line 75 is connected to the discharge port 74b.

There are arranged a plurality of (e.g., eight) processing parts 10. An ozone process, which is described below, is performed in the respective processing parts 10, so as to make a resist film formed on the wafer W water-soluble. After the support pins 70 receives the wafer W which is carried into the vessel body 11 by a conveying arm (not shown), the conveying arm withdraws from the vessel body 11, and thereafter, the support pins 70 are lowered to place the wafer W on the support members 73 on the base 20. Simultaneously or subsequently, the cover 30 is lowered by elevating means, not shown, to bring the lower surface of the cover 30 into tight contact with the upper surface of the circumferential wall 21 through the O-rings 23a and 23b, so that the sealingly-closed processing space S1 is formed. Under this condition, the mixed fluid (i.e., process fluid) of the $O_3$ gas, which has been purified in the course of passing through the ozone supply line 2, and water vapor for processing is supplied into the processing space S1. The process fluid makes the resist film on the wafer W water-soluble.

In the first embodiment, as $O_3$ gas from which impurities such as Cr and NOx are separated can be supplied into the processing part 10, an ozone process of the wafer W, i.e., a process for making a resist film water-soluble can be carried out, without causing metallic contamination of the wafer W. The wafer W which has been subjected to the process for making a resist film water-soluble is conveyed from the processing part 10 to a cleaning part (not shown), and is subjected to a cleaning process by using deionized water or chemical liquid to remove the resist film from the wafer W.

In a conventional method of removing Cr by bubbling $O_3$ gas in deionized water, only about 80% of Cr can be removed. Meanwhile, about 95% of Cr contained in the $O_3$ gas generated by the ozone generator 1 can be removed by using the ozone processing apparatus in the first embodiment.

Second Embodiment

Figure 2:
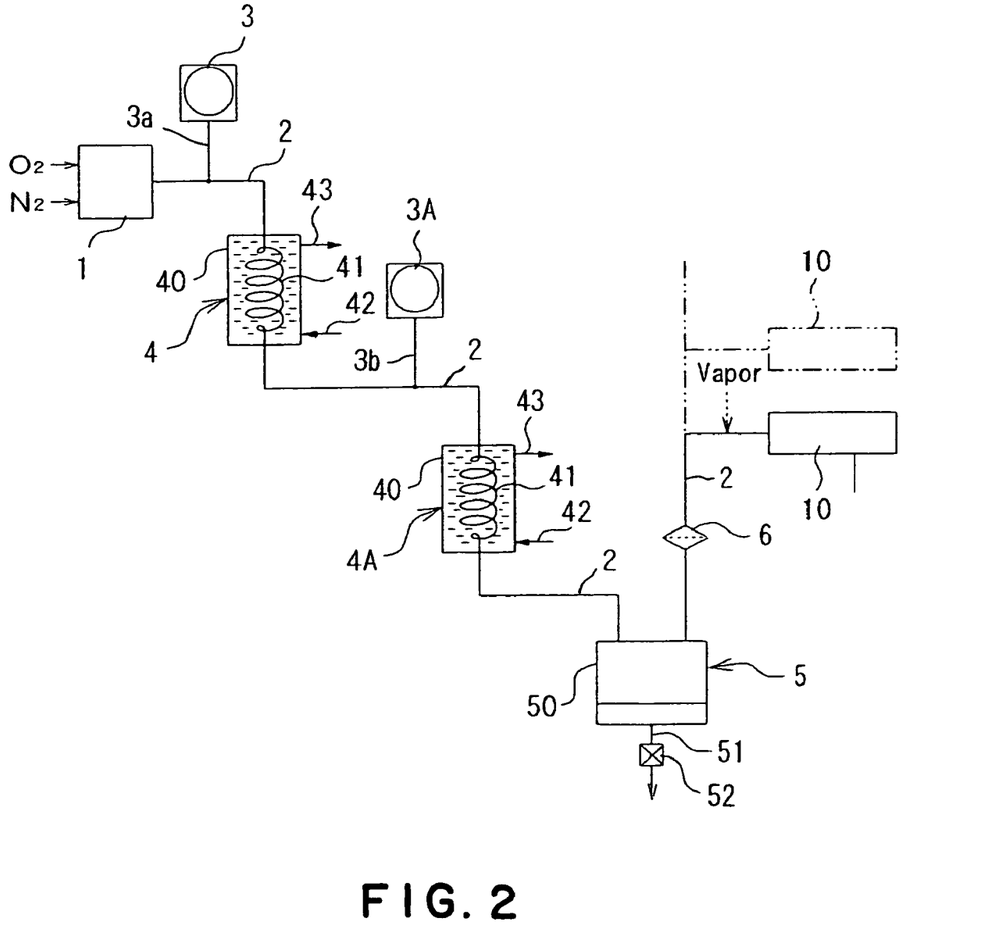
FIG. 2 is a schematic diagram showing the second embodiment of the ozone processing apparatus according to the present invention.

FIG. 2 is a schematic diagram showing the second embodiment of the ozone processing apparatus according to the present invention. In the second embodiment, there are arranged plural sets of steam generators 3 and coolers 4, in order to repeatedly perform the mixing of water vapor with $O_3$ gas and the cooling of the mixed fluid for a plurality of times. As shown in FIG. 2, a second steam generator 3A is connected to supply line 2 at a portion thereof downstream of the cooler 4 (hereinafter referred to as "first cooler 4") through a steam supply line 3b, and a second cooler 4A is arranged in the supply line 2 at a portion thereof downstream of the second steam generator 3A. A gas-liquid separator 5 is connected to the supply line 2 at a portion thereof downstream of the second cooler 4A. It should be noted that the ordinal numbers such as "first" and "second" given to the steam generators and coolers described in the respective embodiments do not necessarily correspond to the ordinal numbers such as "first" and "second" recited in the claims.

In the second embodiment, water vapor generated by the second steam generator 3A is again mixed with the mixed fluid flowing out of the first cooler 4 which contains condensed water into which impurities are dissolved and $O_3$ gas. Following thereto, the thus mixed fluid is again cooled by the second cooler 4A. In this manner, impurities which may possibly remain in the $O_3$ gas flowing out of the first cooler 4 are allowed to be dissolved into the condensed water. Thus, the impurities contained in the $O_3$ gas can be more reliably removed.

Third Embodiment

Figure 3:
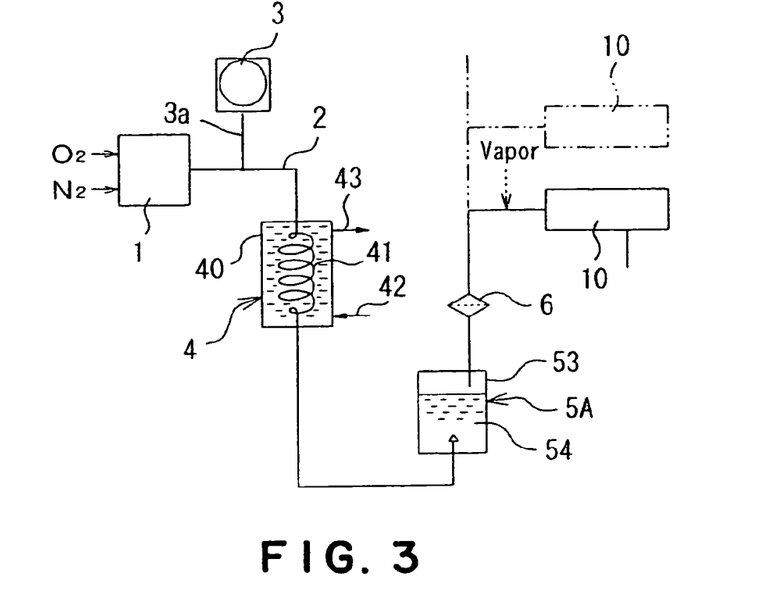
FIG. 3 is a schematic diagram showing the third embodiment of the ozone processing apparatus according to the present invention.

FIG. 3 is a schematic diagram showing the third embodiment of the ozone processing apparatus according to the present invention. In the third embodiment, a gas-liquid separator 5A is composed of a deionized-water storing tank 53 as shown in FIG. 3, instead of the buffer tank 50 in the first embodiment. A fluid inlet connected to the cooler 4 through the supply line 2 is formed in a lower end part of the pure-water storing tank 53. A fluid outlet connected to a processing part 10 through the supply line 2 is formed in an upper end part of the pure-water storing tank 53.

By passing the mixed fluid flowing out of the cooler 4, which contains condensed water into which impurities are dissolved and $O_3$ gas, through deionized water 54 held in the deionized-water storing tank 53, the condensed water with the impurities dissolved therein is dissolved into the deionized water 54, and only the $O_3$ gas is discharged from the deionized-water storing tank 53.

Fourth Embodiment

Figure 7:
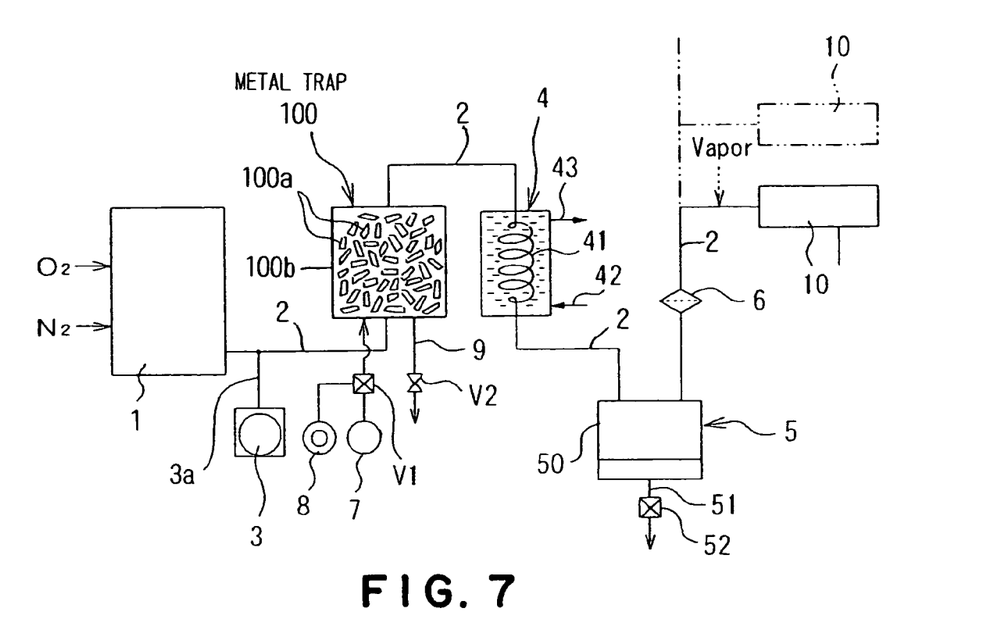
FIG. 7 is a schematic diagram showing the fourth embodiment of the ozone processing apparatus according to the present invention.

FIG. 7 is a schematic diagram showing the fourth embodiment of the ozone processing apparatus according to the present invention. The ozone processing apparatus in the fourth embodiment is constituted by adding a metal adsorber 100 (referred to as "metal trap 100" hereinbelow) to the ozone processing apparatus in the first embodiment. The metal trap 100 is arranged in the ozone supply line 2 at a portion thereof downstream of a joint between the ozone supply line 2 and the steam supply line 3a. The metal trap 100 is composed of a container 100b formed of a fluorine resin (e.g., PFA) which is a highly corrosion-resistant material, and a silicon-containing metal absorbent 100a received in the container 100b to adsorb chrome (Cr) which is a metallic component contained in $O_3$ gas.

It is preferable that the silicon-containing adsorbent 100a be formed of high-purity silicon. However, the silicon-containing adsorbent 100a may be formed of a silicon compound, preferably $SiO_2$ (for example, quartz or silica gel). In order to enlarge a total surface area of the silicon-containing adsorbent 100a in the container 100b to improve adsorption efficiency, the silicon-containing adsorbent 100a is preferably provided in a form of plural small chips. In the most preferred embodiment, a number of small chips formed by crushing a high-purity silicon wafer are contained in the container 100b as the silicon-containing adsorbent 100a.

The mixed fluid of water vapor and $O_3$ gas enters the container 100b from the ozone supply line 2 through a fluid inlet formed in a lower end part of the container 100b, and exits the container 100b to the ozone supply line 2 through a fluid outlet formed in an upper end part of the container 100b. During this step, the mixed fluid of $O_3$ gas and water vapor contact the silicon-containing adsorbent 100a, so that Cr contained in the mixed fluid is adsorbed by the silicon-containing absorbent 100a. It is considered that Cr contained in the $O_3$ gas forms hydrates upon mixture of Cr and water vapor, and that the hydrates are adsorbed by the silicon-containing adsorbent 100a. Thus, there is no need for disposing a cooler at a portion upstream of the metal trap 100 to condense water vapor. The mixed fluid exiting the metal trap 100 passes sequentially through the cooler 4 and the gas-liquid separator 5, whereby remaining impurities such as Cr and NOx are separated from the $O_3$ gas by the same principle as described above.

At a lower part of the container 100b of the metal trap 100, there are connected: a cleaning-liquid supply source 7 and a pure-water supply source 8 via a switching valve V1; a not-shown, dry-air supply source; and a drain line 9 in which a drain valve V2 is arranged. This structure enables a process for recovering the adsorbing capacity of the silicon-containing adsorbent 100a which is deteriorated after it is used. The process can be carried out by: supplying a cleaning liquid such as acidic chemical liquid, e.g., hydrofluoric acid or hydrochloric acid, into the container 100b of the metal trap 100 to remove Cr adhered to the silicon-containing absorbent 100a; supplying deionized water as a rinse liquid to rinse the silicon-containing adsorbent 100a; and thereafter supplying dry air to dry the silicon-containing adsorbent 100a. By periodically performing this recovering process, Cr-adsorbing efficiency of the metal trap 100 can be maintained. In place of the cleaning, rinsing, and drying steps, the silicon-containing adsorbent 100a may be replaced. In this case, it is convenient to use a cartridge containing the silicon-containing adsorbent 100a therein.

In the fourth embodiment, $O_3$ gas is purified by the two steps, that is, the Cr adsorbing step by the metal trap 100, and the step of gas-liquid separating the mixed fluid of $O_3$ gas and condensed water vapor. Thus, the wafer W can be subjected to an ozone process in a processing part 10 by using $O_3$ gas having a less concentration of harmful impurities.

Fifth Embodiment

Figure 8:
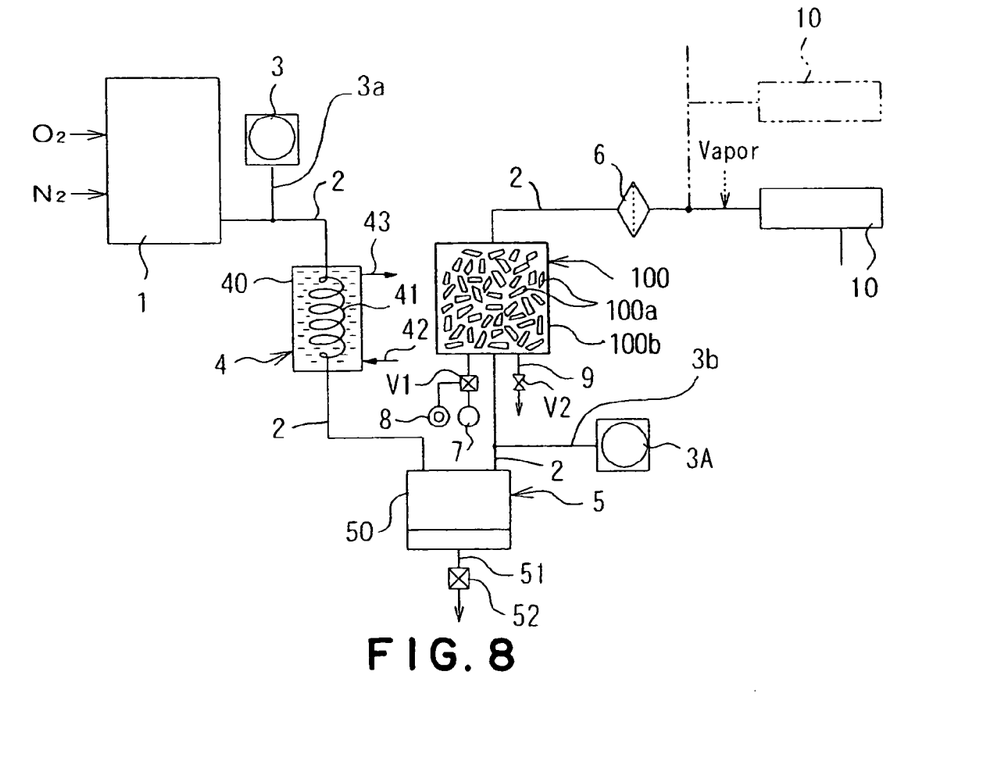
FIG. 8 is a schematic diagram showing the fifth embodiment of the ozone processing apparatus according to the present invention.

FIG. 8 is a schematic diagram showing the fifth embodiment of the ozone processing apparatus according to the present invention. The ozone processing apparatus in the fifth embodiment is constituted by arranging the metal trap 100 in the supply line 2 at a portion thereof downstream of the gas-liquid separator 5 in the ozone processing apparatus in the first embodiment shown in FIG. 1. Water vapor generated by the second steam generator 3A is mixed with the purified $O_3$ gas flown out of the gas-liquid separator 5. When the thus mixed fluid of the $O_3$ gas and the water vapor passes through the metal trap 100, impurities are removed from the $O_3$ gas. Thus, $O_3$ gas having a less concentration of impurities can be obtained.

Sixth Embodiment

Figure 9:
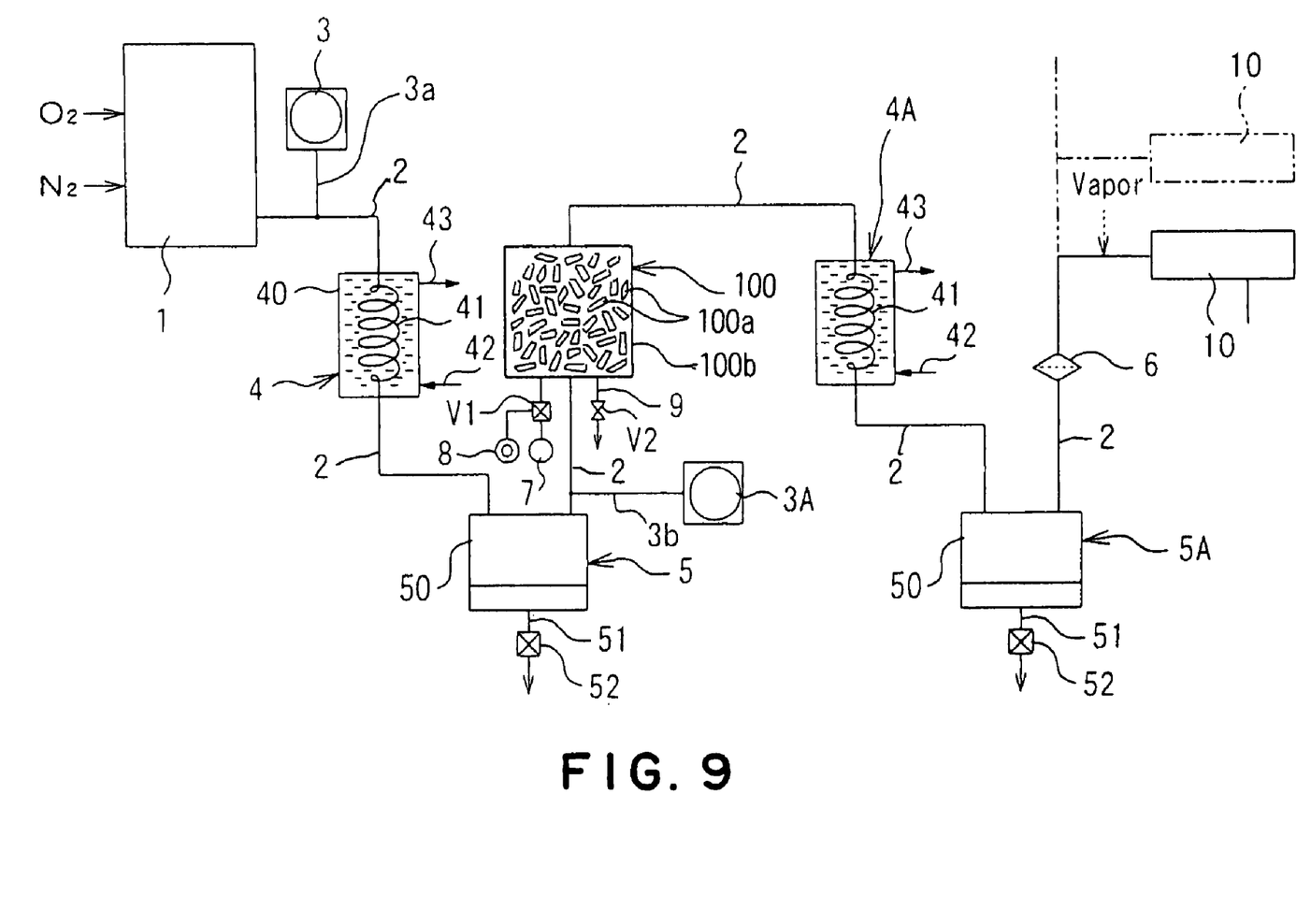
FIG. 9 is a schematic diagram showing the sixth embodiment of the ozone processing apparatus according to the present invention.

FIG. 9 is a schematic diagram showing the sixth embodiment of the ozone processing apparatus according to the present invention. The ozone processing apparatus in the sixth embodiment is constituted by arranging the cooler (second cooler 4A) and the gas-liquid separator (second gas-liquid separator 5A) in the supply line 2 at a portion thereof downstream of the metal trap 100 of the ozone processing apparatus in the fifth embodiment shown in FIG. 8. Thus, $O_3$ gas having a less concentration of impurities can be obtained.

Seventh Embodiment

Figure 10:
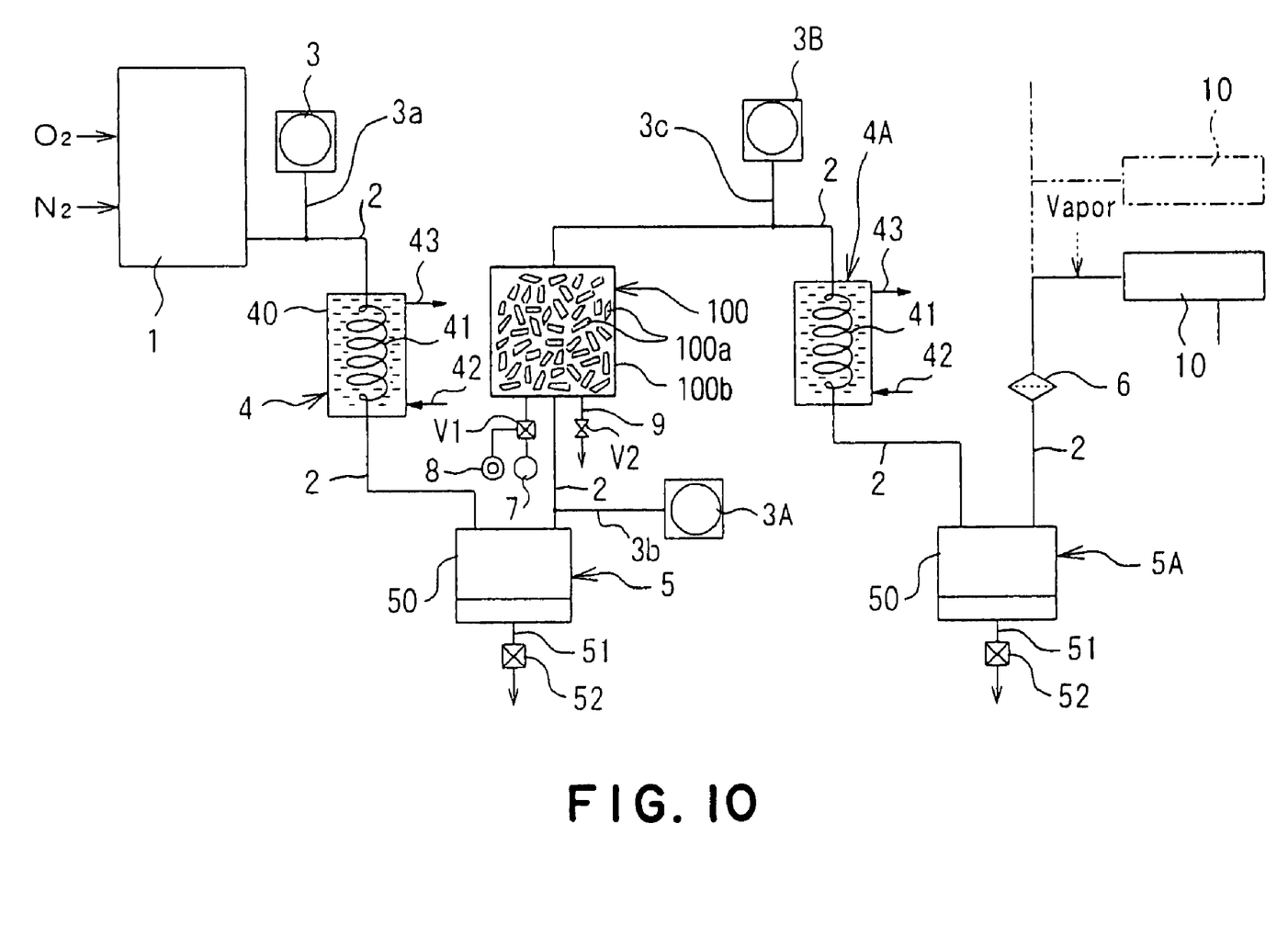
FIG. 10 is a schematic diagram showing the seventh embodiment of the ozone processing apparatus according to the present invention.

FIG. 10 is a schematic diagram showing the seventh embodiment of the ozone processing apparatus according to the present invention. The ozone processing apparatus in the seventh embodiment is constituted by connecting a steam generator (third steam generator 3B) through a third steam supply line 3c to the supply line 2 at a portion thereof between the metal trap 100 and the second cooler 4A in the ozone processing apparatus in the sixth embodiment which is shown in FIG. 9. In the seventh embodiment, as water vapor is further mixed with a mixed fluid flown out of the metal trap 100, impurities remaining in the mixed fluid can be still more dissolved into the water vapor. Thus, a impurities-removing efficiency of by the second cooler 4A and a second gas-liquid separator 5A can be further improved.

Cr component was collected by an impinger from $O_3$ gas that had passed through the metal trap 100 of the ozone processing apparatus in the seventh embodiment, and Cr component was collected by an impinger from $O_3$ gas as generated by an ozone generator G. The collected Cr components were analyzed by an atomic absorptiometer, and it was found that Cr concentration in the former $O_3$ gas was equal to or less than one two-hundredth of Cr concentration in the latter $O_3$ gas.

Although the present invention has been described in detail on the basis of the illustrated embodiments, the present invention is not limited thereto. The present invention can be most suitably applied to a process for purifying $O_3$ gas generated by an ozone generator of discharge type to be used in a process for making a resist soluble in water by using $O_3$ gas and water vapor. However, the present invention may also be applied to various processes requiring clean $O_3$ gas in the technical field of manufacturing a semiconductor device, for example, a process of removing a resist through ashing, a process of cleaning organic matters on a substrate, an oxide-film forming process on a substrate, a process for modifying a surface of a substrate, and so on. In the above respective embodiments, although NOx and Cr posing a practical problem have been taken as examples as impurities to be removed from $O_3$ gas, other metals that react with water-soluble gases and water vapor to form hydrates can be removed. Not limited to a semiconductor wafer, a substrate may be a glass substrate for an LCD or a CD substrate.

The invention claimed is:

1. An ozone processing apparatus that processes a process object by using ozone gas, comprising:
    a processing part having a processing space configured to contain a process object therein;
    an ozone generator configured to generate ozone gas from an oxygen-containing gas through an electric discharge;
    an ozone supply line provided to supply the ozone gas generated by the ozone generator into the processing space of the processing part;
    a steam generator configured to generate water vapor;
    a steam supply line connected to the ozone supply line to supply the water vapor generated by the steam generator into the ozone supply line;
    a metal trap arranged in the ozone supply line at a portion thereof downstream of a joint between the ozone supply line and the steam supply line such that a mixed fluid containing the ozone gas and the water vapor is introduced into the metal trap, the metal trap containing an adsorbent composed of a silicon-containing material;
    a cooler arranged in the ozone supply line at a portion thereof downstream of the metal trap to cool the mixed fluid containing the ozone gas and the water vapor having been passed through the metal trap; and
    a gas-liquid separator arranged in the ozone supply line at a portion thereof downstream of the cooler to separate the ozone gas contained in the mixed fluid cooled by the cooler from condensed water generated by cooling the water vapor.

2. The ozone processing apparatus according to claim 1, wherein the adsorbent is composed of pure silicon or $SiO_2$.

3. The ozone processing apparatus according to claim 1, wherein the metal trap comprises a container containing plural chips composed of the silicon-containing material.

4. The ozone processing apparatus according to claim 1, wherein the gas-liquid separator comprises a tank holding water therein, whereby, when the condensed water and the ozone gas pass through the water in the tank, the condensed water is mixed to the water in the tank to be separated from the ozone gas.

* * * * *